United States Patent
Abadie et al.

(10) Patent No.: US 10,863,371 B2
(45) Date of Patent: Dec. 8, 2020

(54) MEASUREMENT ARRANGEMENT AND MEASUREMENT METHOD

(71) Applicant: Rohde & Schwarz GmbH & Co. KG, Munich (DE)

(72) Inventors: Vincent Abadie, Hoehenschaeftlarn (DE); Corbett Rowell, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 37 days.

(21) Appl. No.: 16/032,645

(22) Filed: Jul. 11, 2018

(65) Prior Publication Data
US 2019/0335346 A1  Oct. 31, 2019

(30) Foreign Application Priority Data

Apr. 25, 2018  (EP) .................................... 18169225

(51) Int. Cl.
| | |
|---|---|
| *H04W 56/00* | (2009.01) |
| *H04W 24/06* | (2009.01) |
| *H04B 17/345* | (2015.01) |
| *H04W 24/02* | (2009.01) |

(52) U.S. Cl.
CPC .......... *H04W 24/06* (2013.01); *H04B 17/345* (2015.01); *H04W 24/02* (2013.01)

(58) Field of Classification Search
CPC ..... H04W 24/06; H04W 24/02; H04B 17/345
USPC ....................................................... 370/252
See application file for complete search history.

(56) References Cited

U.S. PATENT DOCUMENTS

| | | | |
|---|---|---|---|
| 8,451,918 B1 | 5/2013 | Cheng et al. | |
| 2010/0285753 A1 | 11/2010 | Foegelle | |
| 2013/0081261 A1* | 4/2013 | Pienkowski | H01Q 7/005 29/600 |
| 2013/0238264 A1 | 9/2013 | Kazama et al. | |
| 2014/0327586 A1* | 11/2014 | Huff | G01R 29/0821 343/703 |
| 2015/0105038 A1 | 4/2015 | Lascari et al. | |
| 2016/0054440 A1 | 2/2016 | Younis | |
| 2016/0380682 A1* | 12/2016 | Sienkiewicz | H04B 7/0413 375/267 |

(Continued)

FOREIGN PATENT DOCUMENTS

| | | |
|---|---|---|
| CN | 101207447 B | 3/2011 |
| JP | 2000-346886 A | 12/2000 |

(Continued)

OTHER PUBLICATIONS

Extended European search report for European Patent Application No. 18169225.2, dated Nov. 19, 2018, 15 pages.

(Continued)

*Primary Examiner* — Sai Ming Chan
(74) *Attorney, Agent, or Firm* — Westman, Champlin & Koehler, P.A.

(57) ABSTRACT

Measurement arrangement and measurement method for measuring spurious emissions of a wireless device. The measurement arrangement comprises at least two antennas, wherein a first antenna is arranged at proximity of the wireless device. In a first step, frequencies relating to spurious emissions are determined by measuring wireless signals received by the first antenna. In a second step, the spurious emissions are measured by the second device.

15 Claims, 2 Drawing Sheets

(56) References Cited

U.S. PATENT DOCUMENTS

| | | |
|---|---|---|
| 2018/0006745 A1 | 1/2018 | Vanwiggeren |
| 2019/0081612 A1* | 3/2019 | Tang .................. H03H 9/542 |
| 2019/0229817 A1* | 7/2019 | Axmon ............... H04B 7/0874 |
| 2019/0288748 A1* | 9/2019 | Rowell ............... H04B 17/102 |

FOREIGN PATENT DOCUMENTS

| | | |
|---|---|---|
| KR | 10-1104434 B1 | 1/2012 |
| WO | 2015/08877 A1 | 6/2015 |

OTHER PUBLICATIONS

Gorin, Joe: "Enhancing Analysis of Spurious Emissions", Jul. 13, 2011 (Jul. 13, 2011), XP055519874, Retrieved from the Internet: URL:https://www.mwrf.com/test-amp-measurement-analyzers/enhancing-analysis-spurious-emissions *the whole document*, 14 pages.

Rohde & Schwarz: "Faster than ever: measurement of very low-level spurious emissions", May 23, 2017 (May 23, 2017), XP055519870, Retrieved from the Internet: URL:https://cdn.rodhe-schwarz.com/magazine/pdfs_1/article/217/english_19/NEWS_217_04_FSW-K50_en.pdf *the whole document*, 2 pages.

Keysight Technologies: "Keysight Technologies Accelerating Spurious Emission Measurements Using Fast-Sweep Techniques Application Note Introduction", Dec. 5, 2017 (Dec. 5, 2017), XP055519866, Retrieved from the Internet: URL:http://literature.cdn.keysight.com/litweb/pdf/5991-3739EN.pdf *the whole document*, 18 pages.

Jayashankar, Sam: Institute of Electrical and Electronics Engineers: "A Detailed Test Method for Measuring Radiated Spurious Emissions by Signal Substitution and the Effect of Relevant Source Parameters", 2002 IEEE International Symposium on Electromagnetic Compatibility, EMC, Symposium Record, Minneapolis, MN, Aug. 19-23, 2002, IEEE, US, Jan. 1, 2002 (Jan. 1, 2002), pp. 509-514, vol. 1, XP031098596, ISBN: 978-0-7803-7264-1 *p. 510-511*, 6 pages.

* cited by examiner

MEASUREMENT ARRANGEMENT AND MEASUREMENT METHOD

CROSS-REFERENCE TO RELATED APPLICATIONS

The present application claims priority to European Patent Application No. 18169225.2, filed on Apr. 25, 2018, the contents of which are hereby incorporated by reference in its entirety.

TECHNICAL FIELD

The present invention relates to a measurement arrangement. The present invention further relates to a measurement method.

TECHNICAL BACKGROUND

Although applicable in principal to any wireless measurement arrangement, the present invention and its underlying problem will be hereinafter described in combination with testing of wireless communication devices.

The use of wireless communication systems for communication between electronic device increases continually with the advance of high-speed wireless data communications.

During development or production of devices for such communication systems it is necessary to thoroughly test the devices for compliance with communication standards and legal regulations.

For this purpose, testing wireless communication devices may comprise analyzing the radio-frequency emissions of the wireless communication devices. In some cases, a communication device may not only emit wireless signals relating to one or more desired frequencies or frequency ranges. Moreover, it may be possible that due to harmonics or any other reasons further unwanted radio-frequency emissions are emitted. Such unwanted radio-frequency emissions may be considered as spurious emissions. For example, spurious emissions are discussed in the recommendations for ITU-R SM.329-7.

SUMMARY

Against this background, there is the need to provide a versatile and simple measurement of spurious emissions for wireless devices.

The present invention solves this problem with a measurement arrangement and the measurement method with the features of the independent claims. Further embodiments are subject matter of the dependent claims.

According to a first aspect, a measurement arrangement for measuring spurious emissions of a device under test is provided. The measurement system comprises a first antenna, a second antenna and a measurement device. The first antenna may be arranged in a proximity of the device under test. The first antenna is adapted to receive first wireless signals from the device under test. The second antenna is adapted to receive second wireless signals from the device under test. The measurement device is coupled to the first antenna and the second antenna. The measurement device is adapted to identify spurious emissions in a predetermined frequency range of the received first wireless signal. The measurement device is further adapted to determine a number of one or more frequencies of the identified spurious emissions in the first wireless signal. Further, the measurement device is adapted to measure spurious emissions in the second wireless signal at the determined frequencies of the identified spurious emissions in the first wireless signal.

According to a second aspect, a measurement method for measuring spurious emissions of a device under test is provided. The measurement method comprises receiving a first wireless signal from the device under test. In particular, the first wireless signal is received by a first antenna arranged in proximity of the device under test. The method comprises further identifying spurious emissions in a predetermined frequency range of the first wireless signal and determining a number of frequencies of the identified spurious emissions in the first wireless signal. Further, the method comprises receiving a second wireless signal from the device under test by a second antenna and measuring spurious emissions in the second wireless signal at the determined number of frequencies of the identified spurious emissions in the first wireless signal.

The present invention is based on the fact that measuring spurious emissions of a device under test, in particular a measurement of spurious emissions in a three-dimensional environment of a device under test, may be a complex and thus, a time time-consuming procedure. Since the frequencies of spurious emissions usually are unknown, a conventional measurement of spurious emissions in a three-dimensional space has to measure a whole frequency range at each spatial position in a predetermined three-dimensional space.

It is therefore an idea of the present invention to simplify and speed up the measurement of spurious emissions of a wireless device. In particular, it is an idea of the present invention to divide the measurement of the spurious emissions into two tasks. In a first task, the frequencies of the spurious emissions are determined, and subsequently the detailed measurement of the spurious emissions is performed only at the frequencies which have been determined in the first task. In this way, it is no longer necessary to perform a measurement of a whole frequency range at each spatial position of a three-dimensional environment of the device under test.

The present invention further performs the identification of the frequency of the spurious emissions by a first antenna, in particular an antenna which is arranged in spatial proximity of the device under test. For example, the first antenna for identifying the frequencies of the spurious emissions may be arranged at a distance of only a few centimeters, for instance less than 20 cm, 10 cm, 5 cm, 3 cm, or even less than 1 cm. Accordingly, even spurious emissions having only a low signal strength can be received. In particular, no very high amplification causing additional disturbances is necessary for identifying the spurious emissions when using an antenna at a very close proximity of the device under test.

The measurement by the first antenna for identifying the frequencies of the spurious emissions can be performed, for example, by sweeping the frequency of the measurement in a predetermined frequency range, for instance from a first frequency up to a second frequency. The frequency sweep may be performed continuously. Alternatively, it may be also possible to perform a stepwise increment or decrement of the measurement frequency within the predetermined frequency range. For example, the measurement frequency may be increased or decreased from a first predetermined frequency up/down to a second predetermined frequency. The interval for changing the frequency may be constant for the whole frequency range. Alternatively, the interval for increasing/decreasing the frequency may be increased/decreased with an increasing/decreasing measurement frequency. For example, the frequency range for identifying spurious emissions may be in a range between some megahertz (MHz) up to multiple gigahertz (GHz). For example, the frequency range may be between 13 MHz and 90 GHz. However, it is understood that any other frequency range may be used for identifying spurious emissions. In particular, it may be even possible to perform an identification of spurious emissions in more than one frequency range.

As already mentioned above, a spurious emission may be any kind of emission, in particular any kind of radio frequency emission, which does not relate to a desired emission of a radio frequency signal. For example, the spurious emission may relate to a harmonic frequency of an emitted or received radio frequency signal. However, it is understood, that any other kind of unwanted radio frequency emission may be also considered as spurious emission.

After having identified a number of one or more frequencies relating to a spurious emission, a detailed measurement of the spurious emission at the identified one or more frequencies is performed. For this purpose, the spurious emissions are measured by means of a further, second antenna. For measuring the spurious emissions by the second antenna, the measurement of the radio frequency signals relating to the spurious emissions are limited to only a single frequency. In case spurious emissions are determined at more than one frequency, the measurement of the spurious emissions by the second antenna is performed for each of the frequencies separately.

Measuring the spurious emissions by the second antenna may comprise measuring at least one of the following parameters: power of the spurious emissions, polarization, phase, modulation, or any other kind of parameter for characterizing the spurious emission.

The first antenna and the second antenna may be any type of antenna that is adequate to perform the required measurements. The first antenna and the second antenna may be, for example, a microstrip antenna or a horn antenna. However, any other kind of appropriate antenna for measuring the signals emitted by the device under test may be also possible. The antennas may be adapted in size according to the relevant frequencies or wave lengths.

The first antenna and the second antenna may comprise a signal connector and may be connected to the measurement device, for instance, via a measurement cable. Such a measurement cable may be, for example, a cable that has appropriate radio frequency properties like low damping factor in the required frequency range.

The measurement device may comprise, for example, a general purpose processor with corresponding instructions. Further, the measurement device may comprise interfacing elements that are coupled to the processor, to receive the measurement signals from the first antenna and the second antenna and provide the received signals to the processor. These interfacing elements may comprise, for example, analogue-to-digital converters for converting the received signals into digital data so that the digital data may be processed by the processor. Such dedicated analogue-to-digital converters may be coupled to the processor via serial or parallel digital interfaces. Furthermore, further analogue elements like, for example, filters including resistors, capacitors, inductors or the like may be provided between an input port of the measurement device and the processor.

It is understood, that a dedicated measurement device may also be provided in a possible implementation. The dedicated measurement device may be coupled to the first or second antenna and may e.g. be a vector network analyzer, an oscilloscope or the like.

Even though in the above explanation the measurement of the signals provided by the first antenna and the measurement of the signals provided by the second antenna are processed by a single measurement device, it may be also possible to perform the measurement of the first radio frequency signals provided by the first antenna by a first measurement device and to perform the measurement of the signals provided by the second antenna by a second measurement device. In this case, the first measurement device and the second measurement device may be communicatively coupled to provide the identified frequencies of the spurious emissions from the first measurement device to the second measurement device.

Further embodiments of the present invention are subject of the further subclaims and the following descriptions referring to the drawings.

In a possible embodiment, the distance between the device under test and the first antenna is smaller than the distance between the device under test and the second antenna.

Accordingly, the first antenna for identifying the frequency relating to spurious emissions may be arranged closer to the device under test than the second antenna for a detailed measurement of the spurious emissions at the identified frequencies. In this way, the frequencies of the spurious emissions may be determined even if the spurious emissions are emitted only with low power. Due to the close spatial relationship between the device under test and the first antenna, no high amplification of the signals measured by the first antenna is required. Furthermore, the greater distance between the device under test and the second antenna enables a higher flexibility for moving around the second antenna in order to perform a two-dimensional or a three-dimensional measurement of the spurious emissions.

In a possible embodiment, the first antenna is arranged in a near field of the device under test. Further, the second antenna may be arranged in a far field of the device under test.

Accordingly, the frequencies of the spurious emissions can be identified by sweeping over the predetermined frequency range and measuring the received signals in the near field, i.e. in a very close proximity of the device under test. Furthermore, the properties of the emitted spurious emissions in the environment of the device under test may be measured under far field conditions by the second antenna.

In a possible embodiment, both the first antenna and the second antenna are arranged in a near field of the device under test.

Accordingly, the measurement arrangement for measuring the spurious emissions of the device under test requires only small spatial dimensions. If appropriate, the measurement of the spurious emissions by the second antenna can be performed under near field conditions, and subsequently, the measurements may be transformed to far field conditions. In this way, it is possible to determine the spurious emissions of the device under test under far field conditions even though the measurement is performed by a small sized measurement arrangement.

In a possible embodiment, the measurement arrangement comprises an antenna positioning structure. The antenna positioning structure may be adapted to carry the second antenna. Furthermore, the antenna positioning structure may controllably move the second antenna around the device under test.

The antenna positioning structure may comprise an electric drive unit that drives the antenna positioning structure around the device under test. In particular, the antenna positioning structure may subsequently move the second antenna to a number of predetermined positions.

With the antenna positioning structure, it is possible to fully automate a measurement of the spurious emissions in the environment of the device under test. For example, the second antenna may be moved around in a three-dimensional space surrounding the device under test. For example, the measurement antenna may be moved around on a predetermined sphere or hemisphere around the device under test. However, the antenna positioning structure may move around the second antenna on any other appropriate flat or curved plane. The movement of the antenna positioning structure may be controlled by a controller, for instance by a processor of the measurement device.

In a possible embodiment, the second antenna comprises a compact area test range (CATR) or a plane wave converter (PWC).

Accordingly, the propagation of the radio frequency signals, in particular the propagation of the radio frequency signals comprising the spurious emissions may be adapted by appropriate reflecting elements or the like. For example, the antenna may comprise a curved reflector, e.g. a parabolic mirror or the like. However, any other element for reflecting the radio frequency signals or adapting the propagation direction of the emitted electromagnetic waves may be also possible.

In a possible embodiment, the second antenna may comprise a reflector, and the antenna positioning structure may be adapted to carry at least the reflector. Accordingly, the antenna positioning structure may move the reflector of the second antenna around the device under test.

By moving around a reflector of the second antenna, it is possible that further elements of the second antenna may be arranged at a fixed position. Accordingly, the receiving elements of the second antenna and the related cabling to the measurement device can remain at fixed positions even though a measurement in a two-dimensional or three-dimensional space surrounding the device under test can be carried out.

In a possible embodiment, the test arrangement comprises a test carrier. The test carrier may be adapted to carry the device under test and controllably move and/or rotate the device under test.

By moving or rotating the device under test with the test carrier it is possible to controllably change the spatial relationship between the device under test and the second antenna. Accordingly, it is possible to scan the emissions, in particular the spurious emissions of the device under test in a two-dimensional or three-dimensional space.

Hence, to determine the emissions of the device under test, in particular the spurious emissions of the device under test, in a two-dimensional or three-dimensional space, it is possible that only the second antenna is moved around the device under test, or that only the device under test is moved by maintaining the second antenna at a fixed position, or by moving both, the device under test and the second antenna. In this way, a very flexible arrangement for scanning the emissions in the environment of the device under test can be achieved.

In a possible embodiment, the first antenna and/or the second antenna comprises a link antenna. The link antenna may be adapted to establish a communication link to the device under test.

Accordingly, by using a link antenna, it is possible that such a link antenna may be used for both, measuring radio frequency signals emitted by the device under test and for establishing a communication with the device under test. In particular, it may be possible to establish a communication with the device under test for controlling the operation of the device under test. For example, it may be possible to set up the device under test to a predetermined operation mode, to modify the emission properties of the device under test, to control a beam steering of the device under test or to switch on/off or modify any other properties of the device under test.

In a possible embodiment, the measurement device is adapted to control a beam steering of the device under test. Accordingly, a radiation beam of the device under test may be modified by controlling the beam steering of the device under test. In this way, it is possible to set the radiation properties of the device under test to predetermined conditions before measuring the spurious emissions.

In a possible embodiment, the measurement arrangement is adapted to control a beam direction of the device under test to a desired direction. Furthermore, the measurement device is adapted to lock the beam steering during the measurement.

By setting the beam steering of the device under test to a predetermined direction and locking the beam steering during the measurement, the measurement of the emissions of the device under test, in particular the measurement of the spurious emissions, can be performed under well-known, predetermined conditions. Furthermore, a number of two or more subsequent measurements can be performed by applying different predetermined beam steering directions. In this way, the properties of the device under test can be measured for a number of different conditions.

The movable test antenna carrier may e.g. comprise a guide or rail and a slide that carries the test antenna. The movable test antenna carrier may also comprise a slide with wheels or simply be a mechanical holding device that is not fixed to the ground and may therefore be carried into the required position.

The first and the second antenna may be any type of antenna that is adequate to perform the required measurements. Such an antenna may e.g. be a microstrip antenna or a horn antenna and may be adapted in size according to the relevant signal frequencies or wavelengths.

The first and the second antenna may comprise a signal connector and may be coupled to the measurement device e.g. via a measurement cable. Such a measurement cable may e.g. be a cable that has the required RF properties, e.g. a low damping factor in the required frequency ranges.

It is understood, that a dedicated measurement device may also be provided in a possible implementation. The dedicated measurement device may be coupled to the test antenna and may e.g. be a vector network analyzer, an oscilloscope or the like.

Further embodiments of the present invention are subject of the further subclaims and of the following description, referring to the drawings.

In a possible embodiment, the measurement arrangement may comprise a measurement chamber that may accommodate the first antenna, the second and the device under test.

The measurement chamber may comprise a shielding or protective housing that isolates the test arrangement from any outside interference or disturbance during the measurements. It is understood that the measurement chamber may e.g. also comprise a door or sealable opening for accessing the insides of the measurement chamber, e.g. to place the device under test in the measurement chamber.

In a possible embodiment, the measurement chamber may comprise an anechoic chamber.

An anechoic chamber is a measurement chamber that is designed to completely absorb reflections of electromagnetic waves. The interior surfaces of the anechoic chamber may be covered with radiation absorbent material, RAM. RAM is designed and shaped to absorb incident RF radiation as effectively as possible. Measurements in electromagnetic compatibility and antenna radiation patterns require that signals arising from the test setup, like e.g. reflections, are negligible to avoid the risk of causing measurement errors and ambiguities.

With the anechoic chamber the quality of the measurements performed with the test arrangement may therefore be increased.

Especially for smaller devices like e.g. mobile phones or IoT devices, a small anechoic chamber may be sufficient to perform conformance tests because the radiating surface may be relatively small. As explained above, the radiating surface of such devices may be relatively small compared to their overall size.

With the present invention it is therefore now possible perform a measurement of spurious emissions of the device under test, for example a wireless communication device like a mobile phone, a base station, and Internet of things (IoT) device or any other wireless device. In particular, it is possible to measure the spurious emissions relating to a number of frequencies in a two-dimensional or three-dimensional space surrounding the device under test. Since the frequencies relating to the spurious emissions is determined in a first step, the measurement of the spurious emissions relating to all of these frequencies in the space around the device under test can be limited to those of frequencies and thus, the measurement of the spurious emissions can be increased.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

Figure 1:
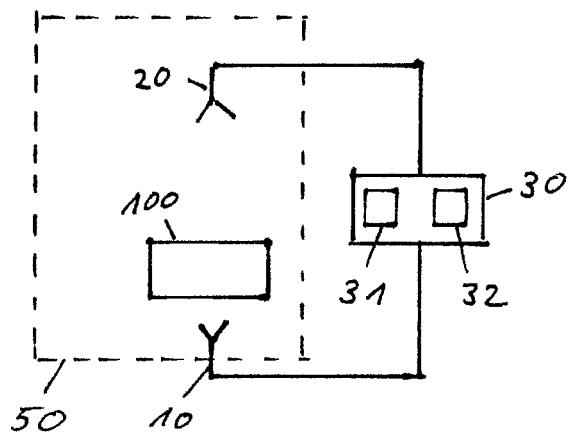
FIG. 1 shows a block diagram of an embodiment of a measurement arrangement according to the present invention.

The appended drawings are intended to provide further under-standing of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated other-wise.

DETAILED DESCRIPTION OF THE DRAWINGS

FIG. 1 shows a block diagram of a test arrangement 1. The test arrangement 1 comprises a first antenna 10, a second antenna 20 and a measurement device 30. The first antenna 10 may be arranged in proximity of a device under test 100. For example, the first antenna 10 may be arranged in a near field distance of the device under test 100. First antenna 10 may be located, for example in a close proximity of the device under test 100, for example in a distance less than 20 cm, 10 cm, 5 cm, 3 cm, or even less than 1 cm. However, it is understood, that any other distance in particular any distance of relative close proximity to device under test 100 may be also possible. Furthermore, depending on the application and the available space, it may be even possible to arrange the first antenna 10 in a far field distance of the device under test 100.

Second antenna 20 may be arranged at a position having a distance to the device under test 100 which is larger than the distance between the first antenna 10 and the device under test 100. For example, second antenna 20 may be arranged in a far field distance of the device under test 100. However, it may be also possible to arrange the second antenna 20 in a near field distance of the device under test 100. In this case, it may be possible to perform a measurement under near field conditions and subsequently transform the measured data to far field conditions by applying a computational transformation.

First antenna 10 may receive radio frequency signals emitted by the device under test 100 and forward the received radio frequency signals to the measurement device 30. Accordingly, the second antenna 20 may also receive measurement signals emitted by the device under test 100 and forward the received measurement signals to the measurement device 30. For example, first antenna 10 and second antenna 20 may be connected to the measurement device 30 by appropriate cables.

During the operation of the device under test 100, the device under test 100 may not only emit the desired radio frequency signals. Moreover, device under test 100 may emit additional, unwanted radio frequency emissions which will be denoted as spurious emissions. In a first operation mode, the first antenna 10 may receive the radio frequency signals emitted by the device under test 100 and provide the received radio frequency signals to measurement device 30. Measurement device 30 may receive the radio frequency signals from the first antenna 10 and analyze the received signal in order to determine spurious emissions. For example, measurement device 30 may sweep through a predetermined frequency range and determine all frequencies at which the device under test 100 has emitted radio frequency signals. Furthermore, measurement device 30 may determine whether the respective received radio frequency signals at the respective frequencies relate to a desired emission or to a spurious emission. In case, the radio frequency signal of a particular frequency relates to an unwanted, spurious emission, the respective frequency is determined. For example, the frequency relating to a spurious emission may be stored in a memory of the measurement device 30.

The analysis for determining spurious emissions may be performed in a predetermined frequency range. For example, the frequency range may cover all frequencies between a predetermined first and a predetermined second frequency. However, it may be also possible to determine a number of more than one frequency range, in particular a number of two or more non-overlapping frequency ranges. For example, measurement device 30 may analyze a frequency range between some megahertz and multiple gigahertz. In an example, measurement device 30 may scan a frequency range between 13 MHz and 90 GHz. However, it is understood that any other frequency range may be also possible.

Measurement device 30 may analyze the signals provided by the first antenna by continuously or stepwise sweeping through the predetermined frequency range. Furthermore, any other method for identifying the frequency relating to spurious emissions received by the first antenna may be also possible.

After the measurement device 30 has identified a number of one or more frequencies relating to spurious emissions, the spurious emissions are measured in more detail. For this purpose, measurement device 30 performs a detailed measurement of the spurious emissions by the signals received by the second antenna 20. For this purpose, the second measurement antenna 20 may be located at an appropriate distance with respect to the device under test 100 and/or at one or more predetermined spatial positions with respect to the device under test 100. It is understood that even though only a single second antenna 20 is illustrated in FIG. 1, it may be also possible to apply more than one second antenna 20. Thus, the second antennas may be located at different spatial positions with respect to the device under test 100.

In order to perform the measurement of the spurious emissions received by the second antenna 20, measurement device 30 may limit the reception and the analysis of the radio frequency signals received by the second antenna 20 to only those frequencies which relate to spurious emissions which have been determined before by analyzing the signals received by the first antenna 10. For this purpose, a receiver connected to the second antenna 20 may be tuned to one of the frequencies relating to the identified spurious emissions. Hence, a single receiver of the measurement device 30 which is connected to the second antenna 20 may be subsequently tuned to the number of frequencies relating to the spurious emissions. Furthermore, it may be also possible that different receivers may be used depending on the respective frequencies. For example, a first receiver may be used for receiving spurious emissions relating to a first frequency range, and a second receiver may be used for receiving spurious emissions relating to another frequency range. It is understood, that the present invention is not limited to only one or two receivers for analyzing the radio frequency signals received by the second antenna 20. Moreover, any number of radio frequency receivers for analyzing the signals received by the second antenna 20 may be possible. In this way, an appropriate receiver can be selected depending on the frequency to be analyzed. Alternatively, the frequencies related to the spurious emissions may be selected by a tuneable filter or the like.

In the previous explanation, the identification of the frequencies relating to the spurious emissions based on the signals received by the first antenna and the subsequent analysis of the spurious emissions by the signals received by means of the second antenna are all performed by measurement device 30. However, it is understood, that it is also possible to use separate measurement units for analyzing the radio frequency signals received by the first measurement antenna 10 and radio frequency signals received by the second measurement antenna 20. For example, a first measurement unit 31 may analyze the radio frequency signals received by the first antenna 10 and determine the frequencies relating to spurious emissions, and a second measurement unit 32 may be used for measuring the radio frequency signals received by the second antenna at the identified frequencies relating to the spurious emissions. In this case, the first measurement unit 31 and the second measurement unit 32 may be communicatively coupled in order to forward the identified frequencies relating to the spurious emissions from the first measurement unit 31 to the second measurement unit 32.

Measurement device 30 may communicate with the device under test 100 in order to apply predetermined settings or adapt the operation mode of the device under test 100. Furthermore, any other communication may be applied between the device under test 100 and the measurement device 30. For this purpose, a wired communication between the device under test 100 and the measurement device 30 may be applied. For example, an optical communication link or communication link by a cable may be used for a communication between the device under test 100 and the measurement device 30. However, it may be also possible to apply a wireless communication between the device under test 100 and the measurement device 30. For this purpose, the first antenna 10 and/or the second antenna 20 may be used as a link antenna for a communication with the device under test 100. In this case, link antenna may not only receive wireless signals from the device under test 100, but also emit wireless signals to the device under test 100.

For example, measurement device 30 may control a beam steering of the device under test 100. Thus, the beam steering of the device under test 100 may be set to a predetermined condition before starting the measurement. In particular, the beam steering of the device under test 100 may be locked to a predetermined setting during the whole measurement of the spurious emissions. In this way, it may be ensured that the radiation properties of the device under test 100 may be kept constant during the measurement.

Furthermore, it may be possible to perform multiple measurements of spurious emissions based on different settings, in particular different settings of the beam steering of the device under test 100.

As can be further seen in FIG. 1, the test arrangement may further comprise a measurement chamber which accommodates at least the first antenna, the second antenna and the device under test 100. However, it is understood that any further components, in particular the antenna positioning structure 41 and/or the test carrier 42 may be also accommodated in the test chamber 50. In particular, test chamber 50 may comprise an anechoic chamber.

Figure 2:
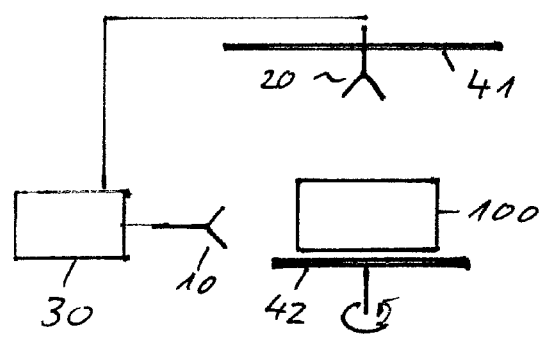
FIG. 2 shows a block diagram of another embodiment of a measurement arrangement according to the present invention.

FIG. 2 shows a further embodiment of a measurement arrangement 1 according to an embodiment. Since this measurement arrangement 1 is based on the measurement arrangement 1 which has been described above in connection with FIG. 1, all the explanations in connection with FIG. 1 also apply to this and the following embodiments.

The embodiment according to FIG. 2 may further comprise an antenna positioning structure 41. The antenna positioning structure 41 may carry the second antenna 20 and move the second antenna 20 around the device under test 100. For example, antenna positioning structure 41 may move the second antenna 20 around the device under test 100 on a predetermined two-dimensional plane. In particular, antenna positioning structure 41 may move around the second antenna 20 on a circular, elliptical, or linear path. However, any other path for moving around the second antenna 20 may be also possible. Furthermore, antenna positioning structure 41 may also move around the second antenna 20 in a three-dimensional space around the device under test 100. For example, the second antenna 20 may be moved on a spherical or hemispherical plane surrounding the device under test 100. However, any other flat or curved plane for moving around the second antenna 20 may be also possible. In this way, it is possible to scan the emissions, in particular the spurious emissions emitted by the device under test 100 in a two-dimensional or three-dimensional space.

In order to determine the spurious emissions of the device under test 100, antenna positioning structure 41 may move around the second antenna 20 and at the same time, measurement device 30 may measure the spurious emissions at the identified frequencies. For example, it may be possible that measurement device 30 is set up to perform a measurement at a first identified frequency relating to spurious emissions and in this configuration, the second antenna 20 is moved around by the antenna positioning structure 41. After the environment of the device under test 100 has been scanned at the first identified frequency relating to a spurious emission, measurement device 30 may be set to the next frequency relating to a spurious emission, and the scanning of the environment by moving around the second antenna is performed.

Alternatively, it may be also possible to perform a measurement of all identified frequencies relating to spurious emissions when the second antenna is moved to a predetermined position. After all frequencies relating to spurious emissions have been measured by measurement device 30, antenna positioning structure 41 may move the second antenna 20 to a further position. In this way, a measurement of all frequencies relating to spurious emissions is performed for each desired spatial position.

Furthermore, measurement arrangement 1 may further comprise a test carrier 42 for carrying the device under test 100. Device under test 100 may be mounted on test carrier 42. Test carrier 42 may controllably move around the device under test 100 or rotate device under test 100 around one or more predetermined axis. Accordingly, by moving or rotating device under test 100 by the test carrier 42, the spatial relationship between the device under test 100 and the second antenna 20 may be also changed. In this way, it is possible to measure the spatial emissions of the device under test 100 for different spatial angles between the device under test 100 and the second measurement antenna 20. Thus, it is also possible to perform a two-dimensional or three-dimensional scan of the spurious emissions by moving and/or rotating the device under test 100 by means of the test carrier 42. As already mentioned above, it may be either possible to perform the movement of the device under test 100 by setting the measurement device 30 to one of the identified predetermined frequencies relating to spurious emissions, or alternatively, measure all identified frequencies relating to spurious emissions while maintaining a constant position of the device under test 100.

Furthermore, it may be even possible to combine a movement of the device under test 100 by the test carrier 42 and a movement of the second antenna 20 by the antenna positioning structure 41. For example, device under test 100 may be rotated along a predetermined axis and further test antenna 20 may be moved around on a predetermined two-dimensional plane. However, any other combination for moving the second antenna 20 and the device under test 100 may be also possible.

Figure 3:
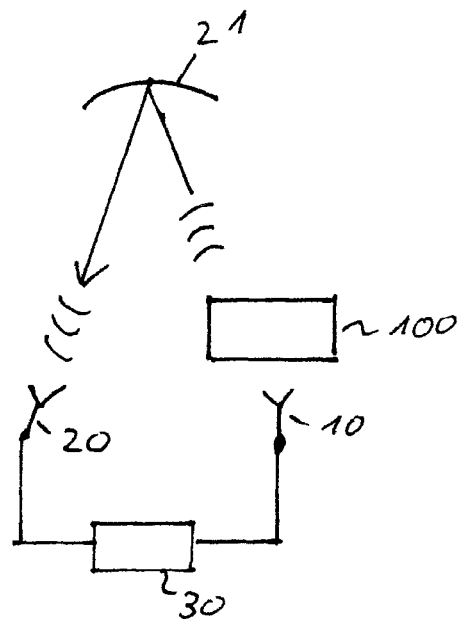
FIG. 3 shows a block diagram of another embodiment of a measurement arrangement according to the present invention.

FIG. 3 shows a further embodiment of a measurement arrangement 1. This embodiment differs from the previously described embodiments in that a reflector 21 is used for reflecting the emissions of the device under test 100 in a signal path between the device under test 100 and the second antenna 20. For example, the reflector may be a parabolic, spherical or plane reflector. In an embodiment, reflector 21 may be a reflector of a compact area test range (CATR), a plane wave converter or the like. In this case, the reflector 21 may be arranged on the antenna positioning structure 41. Accordingly, reflector 21 may be moved around the environment of the device under test 100. Thus, it is possible to scan the emissions, in particular the spurious emissions of the device under test 100 in a two-dimensional or three-dimensional space around the device under test 100 even by arranging the second antenna 20 at a fixed spatial position. However, it may be also possible to arrange a combination of reflector 21 and the second antenna 20 at the antenna positioning structure 41.

For sake of clarity in the following description of the method based FIG. 4 the reference signs used above in the description of apparatus based FIGS. 1-3 will be maintained.

Figure 4:
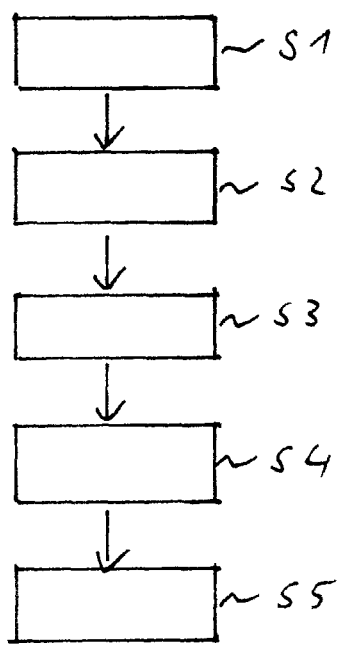
FIG. 4 shows a flow diagram of an embodiment of a measurement method according to the present invention.

FIG. 4 shows a flow diagram of a test method for spurious emissions of the device under test 100. The measurement method comprises receiving S1 a first wireless signal from the device under test 100 by a first antenna 10 arranged in proximity of the device under test 100; identifying S2 spurious emissions in a predetermined frequency range of the first wireless signal; and determining S3 a number of frequencies of the identified spurious emissions in the first wireless signal. The method further comprises receiving S4 a second wireless signal from the device under test 100 by a second antenna 20; and measuring S5 spurious emissions in the second wireless signal at the determined number of frequencies of the identified spurious emissions in the first wireless signal.

Further, the measuring S5 of the spurious emissions by the second antenna may comprise a step of moving the second antenna or at least a reflector of the second antenna around the device under test.

Summarizing, the present invention relates to a measurement arrangement and a measurement method for measuring spurious emissions of a wireless device. The measurement arrangement comprises at least two antennas, wherein a first antenna is arranged at proximity of the wireless device. In a first step, frequencies relating to spurious emissions are determined by measuring wireless signals received by the first antenna. In a second step, the spurious emissions are measured by the second device.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention.

However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

LIST OF REFERENCE SIGNS 1 measurement arrangement
10 first antenna
20 second antenna
21 reflector
30 measurement device
31 first measurement unit
32 second measurement unit
41 antenna positioning structure
42 test carrier
50 measurement chamber

What we claim is:

1. A measurement arrangement for measuring spurious emissions of a device under test, the measurement system comprising:
    a first antenna adapted to receive a first wireless signal from the device under test, wherein the first antenna is arranged in proximity of the device under test;
    a second antenna adapted to receive a second wireless signal from the device under test; and
    a measurement device coupled to the first antenna and the second antenna, and adapted to identify spurious emissions in a predetermined frequency range of the first wireless signal, to determine a number of frequencies related to the identified spurious emissions in the first wireless signal, and to measure spurious emissions in the second wireless signal at the determined number of frequencies of the identified spurious emissions in the first wireless signal,
    wherein the measurement device comprises a number of two or more receivers, each of the number of receivers is connected to the second antenna and configured to receive spurious emissions relating to a predetermined frequency range, and the predetermined frequency ranges of the number of receivers are different from each other, and
    wherein the measurement device is configured to identify spurious emissions with low power in the received first signal without high amplification.

2. The measurement arrangement of claim 1, wherein a distance between the device under test and the first antenna is smaller than the distance between the device under test and the second antenna.

3. The measurement arrangement of claim 1, wherein the first antenna is arranged in a near field of the device under test, and the second antenna is arranged in a far field of the device under test.

4. The measurement arrangement of claim 1, wherein the first antenna and the second antenna are arranged in a near field of the device under test.

5. The measurement arrangement of claim 1, comprising an antenna positioning structure adapted to carry the second antenna and controllably moves the second antenna around the device under test.

6. The measurement arrangement of claim 1, wherein the second antenna comprises a compact area test range or a plane wave converter.

7. The measurement arrangement of claim 1, wherein the second antenna comprises a reflector, and the antenna positioning structure is adapted to carry at least the reflector and move the reflector of the second antenna around the device under test.

8. The measurement arrangement of claim 1, comprising a test carrier adapted to carry the device under test and to controllably move or rotate the device under test.

9. The measurement arrangement of claim 1, wherein at least one of the first antenna and/or the second antenna comprises a link antenna, the link antenna being adapted to establish a communication link to the device under test.

10. The measurement arrangement of claim 1, wherein the in the measurement device is adapted to control a beam steering of the device under test.

11. The measurement arrangement of claim 10, wherein the measurement device is adapted to control a beam direction of the device under test to a desired direction and to lock the beam steering during the measurement.

12. The measurement arrangement of claim 1, comprising a measurement chamber adapted to accommodate the first antenna, the second antenna and the device under test.

13. The measurement arrangement of claim 12, wherein the measurement chamber comprises an anechoic chamber.

14. A measurement method for measuring spurious emissions of a device under test, the measurement method comprising:
    receiving a first wireless signal from the device under test by a first antenna arranged in proximity of the device under test;
    identifying spurious emissions in a predetermined frequency range of the first wireless signal;
    determining a number of frequencies related to the identified spurious emissions in the first wireless signal;
    receiving a second wireless signal from the device under test by a second antenna; and
    measuring spurious emissions in the second wireless signal at the determined number of frequencies of the identified spurious emissions in the first wireless signal,
    wherein the spurious emissions in the second wireless signal are received by a number of two or more receivers, each of the number of receiving spurious emissions relating to a predetermined frequency range, and the predetermined frequency ranges of the number of receivers are different from each other, and
    wherein spurious emissions with low power are identified in the received first signal without high amplification.

15. The method of claim 14, wherein measuring spurious emissions by the second antenna further comprises a step of moving the second antenna or at least a reflector of the second antenna around the device under test.

* * * * *